US006313496B1

(12) United States Patent
Smith

(10) Patent No.: US 6,313,496 B1
(45) Date of Patent: Nov. 6, 2001

(54) CAPACITOR AND METHOD OF FORMING A CAPACITOR

(75) Inventor: Todd E. Smith, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/654,930

(22) Filed: Aug. 31, 2000

Related U.S. Application Data

(62) Division of application No. 09/198,826, filed on Nov. 24, 1998.

(51) Int. Cl.$^7$ .................................................. H01L 27/108
(52) U.S. Cl. ............................ 257/296; 257/324; 361/303
(58) Field of Search ........................... 257/296–311, 324; 361/303–306.3, 311, 312, 313

(56) References Cited

U.S. PATENT DOCUMENTS

| 5,712,208 | * | 1/1998 | Tseng et al. | 438/770 |
| 5,861,190 |   | 1/1999 | Greene et al. | 438/239 |
| 6,163,050 | * | 12/2000 | Hisatomi et al. | 257/324 |

FOREIGN PATENT DOCUMENTS

| 403003357 | * | 1/1991 | (JP) . |
| 3-203329  |   | 3/1991 | (JP) . |
| 03203329  |   | 11/1991 | (JP) . |
| 5-206412  |   | 8/1993 | (JP) . |
| 408330738 | * | 12/1996 | (JP) . |

* cited by examiner

Primary Examiner—Nathan Flynn
Assistant Examiner—Remmon R. Fordé
(74) Attorney, Agent, or Firm—Wells, St. John, Roberts, Gregory & Matkin, P.S.

(57) ABSTRACT

The invention comprises capacitors and methods of forming capacitors. In one implementation, a method of forming a capacitor includes forming a first capacitor electrode. An $Si_3N_4$ comprising capacitor dielectric layer is formed over the first capacitor electrode. The $Si_3N_4$ comprising layer is oxidized in the presence of a chlorine containing atmosphere under conditions which form a silicon oxynitride layer comprising chlorine atop the $Si_3N_4$ layer. In one aspect, the oxidizing sequentially comprises a dry oxidation in the presence of an oxygen containing gas in the substantial absence of chlorine, a dry oxidation in the presence of a gas comprising oxygen and chlorine, and a wet oxidation comprising chlorine. A second capacitor electrode is formed over the chlorine containing silicon oxynitride layer. In one implementation, a method of forming a capacitor comprises forming a first capacitor electrode. A capacitor dielectric layer comprising a silicon oxynitride region is formed over the first capacitor electrode. The silicon oxynitride region is exposed to a chlorine containing atmosphere under conditions effective to incorporate chlorine within the silicon oxynitride region. A second capacitor electrode is formed over the chlorine containing silicon oxynitride layer. In one implementation, a capacitor comprises a first capacitor electrode, a second capacitor electrode, and a capacitor dielectric material received intermediate the first and second capacitor electrodes. At least a portion of the capacitor dielectric material comprises chlorine atoms present at a concentration of at least about $5 \times 10^{20}$ atoms/cm$^3$.

20 Claims, 1 Drawing Sheet

US 6,313,496 B1

CAPACITOR AND METHOD OF FORMING A CAPACITOR

CROSS REFERENCE TO RELATED APPLICATION

This a Divisional of U.S. patent application Ser. No. 09/198,826, filed Nov. 24, 1998, and titled "Capacitor and Method of Forming a Capacitor".

TECHNICAL FIELD

This invention relates generally to methods of forming capacitors, and to capacitor constructions.

BACKGROUND OF THE INVENTION

Capacitors are typically comprised of a pair of opposing conductive electrodes which are separated by one or more dielectric materials. A continuing goal in semiconductor circuitry fabrication is to shrink individual devices to increase circuit density and thereby the amount of circuitry which can be fit into a given space. Such can be achieved by both reducing the area over the substrate consumed by an individual device as well as in reducing its thickness.

One factor affecting a capacitor's construction and operation is breakdown voltage. Breakdown voltage is that voltage which causes the capacitor to form a conductive short between the electrodes through the dielectric material, thereby destroying the capacitor. It is function of the composition of the dielectric material as well as it thickness, among other factors. Generally if the inherent breakdown voltage of a given material can be increased, thickness of a capacitor dielectric layer for a given application could be reduced.

Silicon dioxide, silicon nitride and silicon oxynitride continue to find use as capacitor dielectric materials. One common composite of these materials utilized in capacitors as the dielectric layer is an oxide-nitride-oxide material commonly referred to as ONO. The first formed oxide layer comprises silicon dioxide typically formed by native oxidation of an oxidizable first or lower capacitor electrode comprising, for example, conductively doped polysilicon. Such typically produces a silicon dioxide layer approximately 20 Angstroms thick. Subsequently, a silicon nitride layer is deposited, such as by combining dichlorosilane and ammonia in a low pressure chemical vapor deposition reactor at 650° C. Such layer as deposited may not be as dense as desired. Accordingly, the silicon nitride layer is subjected to an oxidation step to densify and fill any pinholes inherent in the deposition which produces such layer. An example oxidation step flows equal amounts of $H_2$ and $O_2$ at atmospheric pressure and 800° C. This transforms the outer 20 Angstroms or so of the silicon nitride layer into a silicon oxynitride material, typically designated as $SiO_xN_y$. This layer is what typically constitutes the outer "O" of the ONO capacitor dielectric layer or material.

Accordingly, it would be desirable to develop techniques and materials which inherently result in increased breakdown voltage of ONO capacitors, and silicon oxynitride capacitor dielectric layers particularly.

SUMMARY OF THE INVENTION

The invention comprises capacitors and methods of forming capacitors. In one implementation, a method of forming a capacitor includes forming a first capacitor electrode. An $Si_3N_4$ comprising capacitor dielectric layer is formed over the first capacitor electrode. The $Si_3N_4$ comprising layer is oxidized in the presence of a chlorine containing atmosphere under conditions which form a silicon oxynitride layer comprising chlorine atop the $Si_3N_4$ layer. In one aspect, the oxidizing sequentially comprises a dry oxidation in the presence of an oxygen containing gas in the substantial absence of chlorine, a dry oxidation in the presence of a gas comprising oxygen and chlorine, and a wet oxidation comprising chlorine. A second capacitor electrode is formed over the chlorine containing silicon oxynitride layer.

In one implementation, a method of forming a capacitor comprises forming a first capacitor electrode. A capacitor dielectric layer comprising a silicon oxynitride region is formed over the first capacitor electrode. The silicon oxynitride region is exposed to a chlorine containing atmosphere under conditions effective to incorporate chlorine within the silicon oxynitride region. A second capacitor electrode is formed over the chlorine containing silicon oxynitride layer.

In one implementation, a capacitor comprises a first capacitor electrode, a second capacitor electrode, and a capacitor dielectric material received intermediate the first and second capacitor electrodes. At least a portion of the capacitor dielectric material comprises chlorine atoms present at a concentration of at least about $5 \times 10^{20}$ atoms/$cm^3$.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
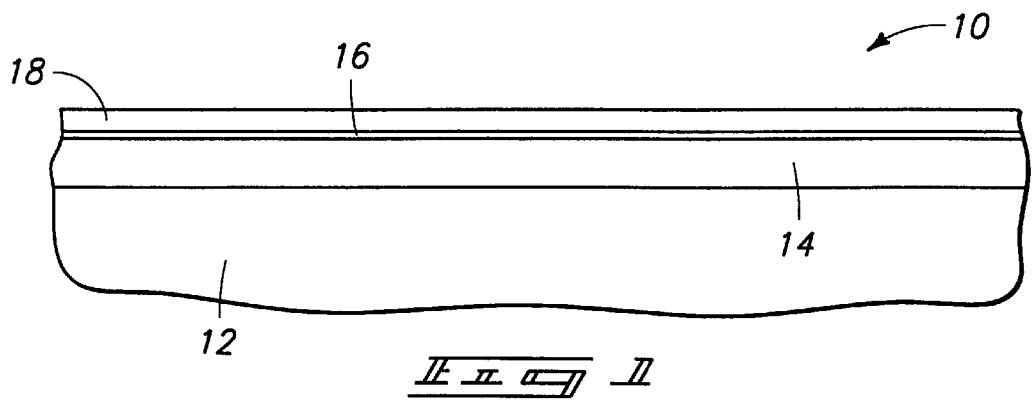
FIG. 1 is a diagrammatic sectional view of a semiconductor wafer fragment at one processing step in accordance with the invention.

Referring to FIG. 1, a semiconductor wafer in process is indicated generally with reference numeral 10. Such comprises a substrate 12, with an example material being monocrystalline silicon. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

A first capacitor electrode layer 14 is formed over substrate 12. Any suitable conductive material might be utilized, with conductively doped polysilicon being but one example. A silicon dioxide layer 16 is typically formed over first capacitor electrode 14 where such material is inherently oxidizable under conventional processing conditions. For example as explained above, polysilicon will inherently oxide under typical clean room ambient conditions to transform an outermost portion of layer 14 into about a 20 Angstroms thick layer of silicon dioxide.

A $Si_3N_4$ comprising capacitor dielectric layer 18 is formed over oxide layer 16, and accordingly over first capacitor electrode 14. A preferred forming process is chemical vapor deposition using dichlorosilane and ammonia at a pressure of 1500 mTorr and a temperature of 650° C. to form a layer 18 having a thickness of from 50 Angstroms to 60 Angstroms. Layer 18 at this point in the process preferably consists essentially of $Si_3N_4$.

Figure 2:
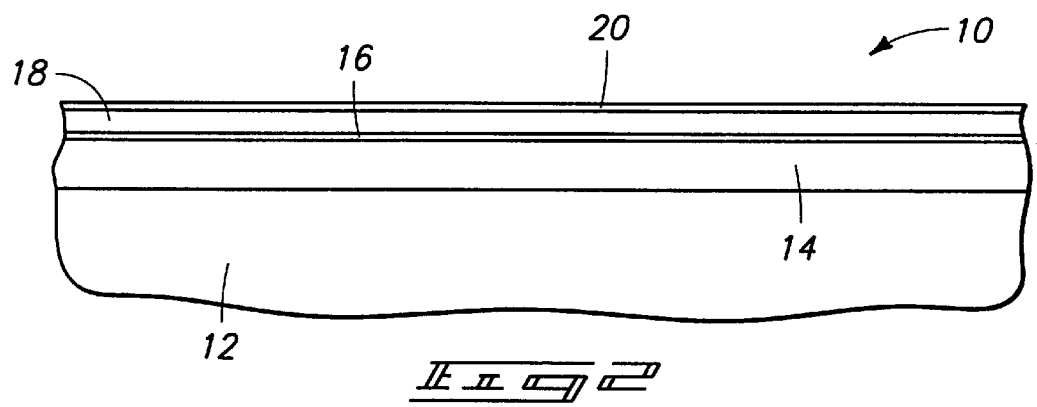
FIG. 2 is a view of the FIG. 1 wafer at a processing step subsequent to that shown by FIG. 1.

Referring to FIG. 2, $Si_3N_4$ layer 18 is oxidized in the presence of a chlorine-containing atmosphere under conditions which form a silicon oxynitride layer 20 comprising chlorine atop $Si_3N_4$ layer 18. A goal in such oxidizing is to achieve at least a portion of layer 20 to have at least about $5 \times 10^{20}$ chlorine atoms/cm$^3$. More preferably, the concentration of chlorine is at least $1 \times 10^{21}$ chlorine atoms/cm$^3$, and even more preferably at least $1 \times 10^{22}$ chlorine atoms/cm$^3$. Further preferably, the chlorine incorporation is ideally such that no portion of the silicon oxynitride layer has a concentration approaching $1 \times 10^{25}$ chlorine atoms/cm$^3$. This is desirable to avoid potential corrosion or other problems by incorporation of too much chlorine. The preferred oxidizing can equally distribute the chlorine dopant throughout layer 20, or perhaps more preferably provide a greater concentration of chlorine in an outer portion thereof than in an inner portion.

Such oxidizing might occur in a number of ways, with preferred examples and a reduction-to-practice example being provided below. Preferably, the oxidizing comprises a combination of wet and dry oxidations, with chlorine being present in gaseous form in at least one and preferably both of such wet and dry oxidations. The wet oxidizing is preferably accomplished by feeding an oxygen containing gas (i.e., $O_2$ others) and $H_2$ to a reaction chamber, wherein a majority of the wet oxidizing comprises feeding more of the oxygen containing gas, preferably at least about twice as much, as the $H_2$.

One preferred oxidizing process sequentially comprises a dry oxidation in the presence of an oxygen containing gas and the substantial absence of chlorine, a dry oxidation in the presence of a gas comprising oxygen and chlorine, and a wet oxidation comprising chlorine. Example chlorine source gases include dichloroethylene and hydrochloric acid. Such can be delivered to the reaction chamber by bubbling an inert carrier gas through liquid dichloroethylene or liquid hydrochloric acid. All oxidizing steps are preferably conducted at a temperature of at least about 700° C., and at atmospheric pressure or lower. The total wet oxidation time comprising chlorine preferably is at least 5 times as great or long as the total of the prior dry oxidations. Further, the oxidizing preferably includes a finishing dry oxidation step after the wet oxidation in the substantial absence of chlorine. The first dry oxidations typically and preferably form approximately 10% of the total thickness of silicon oxynitride layer 20. The wet oxidation(s) preferably forms about 85% of the total thickness of layer 20. The final preferred dry oxidation preferably forms 5% or less of the total thickness of layer 20.

Figure 3:
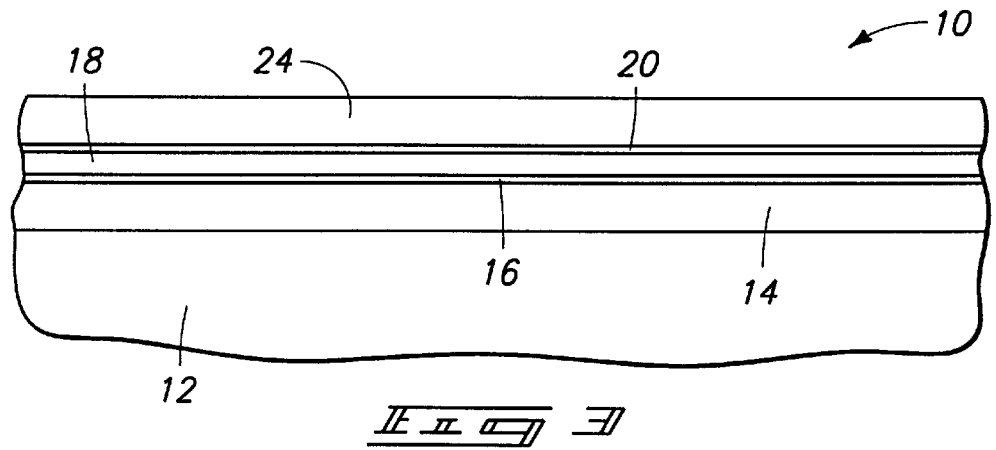
FIG. 3 is a view of the FIG. 1 wafer at a processing step subsequent to that shown by FIG. 2.

Referring to FIG. 3, a second capacitor electrode 24 is formed over chlorine-containing silicon oxynitride layer 20.

The invention also contemplates initial fabrication of a capacitor dielectric layer comprising a silicon oxynitride region, such as by oxidation of a silicon nitride layer, not necessarily having incorporated chlorine atoms. Thereafter, the silicon oxynitride layer is exposed to a chlorine-containing atmosphere under conditions effective to incorporate chlorine within the silicon oxynitride layer. Example preferred conditions include exposure to a chlorine containing atmosphere at a temperature of at least 700° C., and more preferably at a temperature of at least 800° C. Pressure can be anywhere from below atmospheric pressure, to atmospheric pressure, to above atmospheric pressure. Above atmospheric pressure might be preferred to facilitate driving of chlorine atoms into the silicon oxynitride layer. Such processing might have a greater inherent tendency to form a higher concentration of chlorine dopant atoms in the outer portion of the silicon oxynitride layer than in inner portions thereof.

The invention also contemplates capacitor construction, having capacitor dielectric material received intermediate first and second capacitor electrodes having a minimum chlorine atom concentration of at least about $5 \times 10^{20}$ atoms/cm$^3$, and independent of silicon oxynitride presence. Other example capacitor dielectric materials include pure $SiO_2$, pure $Si_3N_4$, titanium oxide, yttrium oxide, tantalum oxides barium strontium titanate, and others. Chlorine atom concentration is again preferably maintained at no greater than $1 \times 10^{25}$ atoms/cm$^3$.

One reduction-to-practice example involving oxidation of the outer silicon oxynitride portion of a polysilicon-ONO-polysilicon capacitor is shown below.

| | TIME | TEMP | $H_2$ FLOW | $O_2$ FLOW | DCE FLOW | $N_2$ FLOW |
|---|---|---|---|---|---|---|
| Step 1 | 1 min | 775° C. | 0 | 0 | 0 | 10 slm |
| Step 2 | 1 min | 775° C. | 0 | 0 | 0 | 10 slm |
| Step 3 | 2 min | 775° C. | 0 | 0 | 0 | 10 slm |
| Step 4 | 12 min | 775° C. | 0 | 0.5 slm | 0 | 10 slm |
| Step 5 | 1 min | 775° C. | 0 | 0.5 slm | 0 | 10 slm |
| Step 6 | 20 min | 775° C. | 0 | 0.5 slm | 0 | 10 slm |
| Step 7 | 3 min | 800° C. | 0 | 0.5 slm | 0 | 10 slm |
| Step 8 | 5 min | 800° C. | 0 | 6 slm | 0 | 0 |
| Step 9 | 1 min | 800° C. | 0 | 6 slm | 50 sccm | 0 |
| Step 10 | 3 min | 800° C. | 0 | 6 slm | 50 sccm | 0 |
| Step 11 | 1 min | 800° C. | 3 slm | 6 slm | 50 sccm | 0 |
| Step 12 | 34 min | 800° C. | 3 slm | 6 slm | 50 sccm | 0 |
| Step 13 | 15 min | 800° C. | 0 | 6 slm | 0 | 1 slm |
| Step 14 | 8 min | 775° C. | 0 | 0 | 0 | 10 slm |
| Step 15 | 5 min | 775° C. | 0 | 0 | 0 | 10 slm |
| Step 16 | 12 min | 775° C. | 0 | 0 | 0 | 10 slm |

DCE flow constitutes the flow of nitrogen gas bubbled through a solution of dichloroethylene at 20° C. which was then fed to the reaction chamber. Chlorine incorporation into the silicon oxynitride layer was determined to be about $1 \times 10^{23}$ atoms/cm$^3$. Comparing these capacitors to identically fabricated control capacitors but for the chlorine doping during oxidation resulted in a significant increase in breakdown voltage and a reduction in leakage current as compared to the control capacitors.

The prior art processing involving formation of silicon nitride utilizing dichlorosilane as a precursor has been determined to result in finished chlorine incorporation in the prior art and control capacitors of $1.8 \times 10^{21}$ atoms/cm$^3$. Incorporation of chlorine of at least 2.5 times this amount is expected to result in noticeable improvements in breakdown voltage and leakage reduction in capacitors, with factors of 10, 100 or more times this background amount having been discovered to achieve very significant improvements.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A capacitor comprising:

a first capacitor electrode;

a second capacitor electrode; and capacitor dielectric material received intermediate the first and second capacitor electrodes, at least a portion of the material comprising chlorine atoms present at a concentration of at least about $4.8 \times 10^{21}$ atoms/cm$^3$.

2. The capacitor of claim 1 wherein said portion has a chlorine atom concentration of at least about $1 \times 10^{22}$ atoms/cm$^3$.

3. The capacitor of claim 1 wherein said portion has a chlorine atom concentration of no greater than about $1 \times 10^{25}$ atoms/cm$^3$.

4. The capacitor of claim 1 wherein said portion has a chlorine atom concentration of at least about $1 \times 10^{22}$ atoms/cm$^3$ and no greater than about $1 \times 10^{25}$ atoms/cm$^3$.

5. The capacitor of claim 1 wherein no portion of all capacitor dielectric material intermediate the first and second capacitor electrodes has a chlorine atom concentration of greater than about $1 \times 10^{25}$ atoms/cm$^3$.

6. The capacitor of claim 1 wherein the portion of the material comprises silicon oxynitride.

7. The capacitor of claim 1 wherein the material comprises layers of oxide, silicon nitride, and silicon oxynitride.

8. The capacitor of claim 1 wherein the material comprises layers of oxide, silicon nitride, and silicon oxynitride; the portion being present at least in the silicon oxynitride layer.

9. A capacitor comprising:

a first capacitor electrode;

a second capacitor electrode; and capacitor dielectric material received intermediate the first and second capacitor electrodes, the material comprising layers of oxygen, silicon nitride, and silicon oxynitride; at least the silicon oxynitride layer comprising chlorine atoms, the silicon oxynitride layer comprising an inner portion and an outer portion, the outer portion of the silicon oxynitride layer having a greater concentration of chlorine than the inner portion of the silicon oxynitride layer.

10. The capacitor of claim 9 wherein the outer portion has a chlorine atom concentration of at least about $4.5 \times 10^{21}$ atoms/cm$^3$.

11. The capacitor of claim 9 wherein the outer portion has a chlorine atom concentration of at least about $1 \times 10^{22}$ atoms/cm$^3$.

12. The capacitor of claim 9 wherein the outer portion has a chlorine atom concentration of no greater than about $1 \times 10^{25}$ atoms/cm$^3$.

13. The capacitor of claim 9 wherein the outer portion has a chlorine atom concentration of at least about $1 \times 10^{22}$ atoms/cm$^3$ and no greater than about $1 \times 10^{25}$ atoms/cm$^3$.

14. A capacitor comprising:

a first capacitor electrode;

a second capacitor electrode; and a capacitor dielectric functioning region received intermediate the first and second capacitor electrodes, the capacitor dielectric functioning region having at least an outer portion and an inner portion, the outer portion having a greater concentration of chlorine than any concentration of chlorine in the inner portion.

15. The capacitor of claim 14 wherein the innermost portion comprises chlorine.

16. The capacitor of claim 14 wherein the outermost portion has a chlorine atom concentration of at least about $4.5 \times 10^{21}$ atoms/cm$^3$.

17. The capacitor of claim 14 wherein the outermost portion has a chlorine atom concentration of at least about $1 \times 10^{22}$ atoms/cm$^3$.

18. The capacitor of claim 14 wherein the outermost portion has a chlorine atom concentration of no greater than about $1 \times 10^{25}$ atoms/cm$^3$.

19. A capacitor comprising:

a first capacitor electrode;

a second capacitor electrode; and a capacitor dielectric functioning region received intermediate the first and second capacitor electrodes, the capacitor dielectric functioning region having at least an outer portion and an inner portion, the outer portion having a greater concentration of chlorine than any concentration of chlorine in the inner portion, wherein the outer portion has a chlorine atom concentration of at least about $1 \times 10^{22}$ atoms/cm$^3$ and no greater than about $1 \times 10^{25}$ atoms/cm$^3$.

20. The capacitor of claim 14 wherein the outermost portion has a chlorine atom concentration of at least about $1 \times 10^{22}$ atoms/cm$^3$ and no greater than about $1 \times 10^{25}$ atoms/cm$^3$.

* * * * *

UNITED STATES PATENT AND TRADEMARK OFFICE
CERTIFICATE OF CORRECTION

PATENT NO.    : 6,313,496 B1
DATED         : November 6, 2001
INVENTOR(S)   : Todd E. Smith It is certified that error appears in the above-identified patent and that said Letters Patent is hereby corrected as shown below:

Column 4,
Line 12, replace "capacitor construction," with -- capacitor constructions --

Column 6,
Line 16, replace "an outer portion and an inner portion, the outer portion" with -- an outermost portion and an innermost portion, the outermost portion --
Line 18, replace "in the inner portion." with -- in the innermost portion. --

Signed and Sealed this

Twenty-first Day of May, 2002

Attest:

JAMES E. ROGAN
Attesting Officer     Director of the United States Patent and Trademark Office